United States Patent
Muto et al.

(10) Patent No.: US 7,182,995 B2
(45) Date of Patent: Feb. 27, 2007

(54) PLATED-POLYESTER ARTICLE AND PRODUCTION PROCESS THEREOF

(75) Inventors: Koji Muto, Osaka (JP); Hiroshi Hayami, Osaka (JP); Yoshito Sakamoto, Osaka (JP); Shinya Nishikawa, Osaka (JP); Shohei Okabe, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/526,929

(22) PCT Filed: Sep. 9, 2003

(86) PCT No.: PCT/JP03/11505

§ 371 (c)(1),
(2), (4) Date: Mar. 8, 2005

(87) PCT Pub. No.: WO2004/022815

PCT Pub. Date: Mar. 18, 2004

(65) Prior Publication Data

US 2006/0121249 A1    Jun. 8, 2006

(30) Foreign Application Priority Data

Sep. 9, 2002    (JP) .......................... 2002-263344

(51) Int. Cl.
*B32B 15/09*    (2006.01)
*B32B 15/20*    (2006.01)
*B32B 27/16*    (2006.01)
*B32B 27/20*    (2006.01)
*B32B 27/36*    (2006.01)

(52) U.S. Cl. ...................... 428/141; 428/213; 428/215; 428/216; 428/335; 428/330; 428/331; 428/457; 428/458; 428/480; 428/482

(58) Field of Classification Search ...................... None
See application file for complete search history.

(56) References Cited

U.S. PATENT DOCUMENTS

| 4,369,207 A | * | 1/1983 | Matsumura et al. | ........ 427/501 |
| 4,429,020 A | * | 1/1984 | Luch | .......... 428/625 |
| 4,603,092 A | * | 7/1986 | Luch | .......... 428/626 |
| 4,664,983 A | * | 5/1987 | Nakamura et al. | .......... 428/458 |

(Continued)

FOREIGN PATENT DOCUMENTS

EP    1 162 866 A2    12/2001

(Continued)

*Primary Examiner*—Vivian Chen
(74) *Attorney, Agent, or Firm*—McDermott Will & Emery LLP

(57) ABSTRACT

Disclosed herein is a plated-polyester article with a plating layer formed on the surface of a polyester article. The polyester article is irradiated with ionizing radiation to crosslink a polyester resin, the arithmetic mean roughness Ra of the surface of the plating layer is at most 1 µm, and adhesion strength between the polyester article and the plating layer is at least 2 MPa. A production process of a plated-polyester article, which comprises the step of melt-forming a resin composition obtained by dispersing an inorganic filler having an average particle diameter of 1 to 10 µm in a proportion of 5 to 20 vol. % in a polyester resin, which can be crosslinked by irradiation with ionizing radiation, into a polyester article, is also disclosed.

11 Claims, 1 Drawing Sheet

U.S. PATENT DOCUMENTS

| | | | |
|---|---|---|---|
| 4,950,360 A * | 8/1990 | Murao et al. | 216/23 |
| 4,997,724 A * | 3/1991 | Suzuki et al. | 428/626 |
| 5,186,802 A * | 2/1993 | Kadokura | 174/50 |
| 5,258,200 A * | 11/1993 | Mayernik | 427/8 |
| 5,569,545 A * | 10/1996 | Yokono et al. | 428/626 |
| 6,068,935 A | 5/2000 | Hayami | |
| 6,286,207 B1 * | 9/2001 | Oura et al. | 29/846 |
| 6,451,441 B1 * | 9/2002 | Nishimoto et al. | 428/461 |
| 6,523,256 B1 * | 2/2003 | Oura et al. | 29/852 |
| 6,866,739 B2 * | 3/2005 | Nishimoto et al. | 156/233 |

FOREIGN PATENT DOCUMENTS

| | | |
|---|---|---|
| JP | 7-157882 A | 6/1995 |
| JP | 9-227661 A | 9/1997 |
| JP | 10-219463 A | 8/1998 |
| JP | 11-255992 A | 9/1999 |
| JP | 2003-342741 * | 12/2003 |
| WO | WO 99/10435 A1 | 3/1999 |
| WO | WO 99/54888 A1 | 10/1999 |

* cited by examiner

PLATED-POLYESTER ARTICLE AND PRODUCTION PROCESS THEREOF

TECHNICAL FIELD

The present invention relates to a plated-polyester article and a production process thereof, and particularly to a plated-polyester article which is excellent in surface smoothness and adhesion of its plating layer, has high heat resistance and can be flame-retarded as needed and a production process thereof.

The plated-polyester article according to the present invention may be mounted by wire bonding or reflow soldering and is suitable for use as an electronic part such as a three-dimensional molded interconnect device (also referred to as "three-dimensional wiring board"; hereinafter abbreviated as "MID") used in, for example, a semiconductor package, or the like.

BACKGROUND ART

In a field of electronics mounting technology, semiconductors, functional parts and/or the like are arranged on a circuit substrate and connected making the best use of film-forming technology, micro-connection technology, sealing technology and the like, and these are three-dimensionally incorporated together with other component parts into a basket-like package to fabricate an electronic apparatus having necessary performance. In packages of semiconductor chips such as IC and LSI, various mounting system are developed.

There has heretofore been developed a wire bonding method that electrodes formed in a semiconductor chip are electrically connected to inner leads of an external wiring with bonding wires within a semiconductor package, and the package is sealed with an epoxy resin, ceramic or the like. In recent years, the degree of integration of semiconductor chips has improved year by year, and the number of terminals has increased attending on this. Therefore, packages of the area array lead type such as BGA (ball grid array) applying the technique of a multi-layer printed wiring board have been developed have been developed for the purpose of miniaturizing the package to achieve high-density mounting.

Further, there has recently been a strong demand for rationalization of wiring, such as rationalization within a device, space saving and improvement in assembling ability, in addition to miniaturization, weight saving and improved performance of electronic apparatus. MID with wirings three-dimensionally formed on a surface of an injection-molded article has been developed against such a demand for rationalization of wiring. In MID, unlike the printed wiring board, a plating film (plating layer) is used in place of a copper foil to form a circuit.

In order to produce MID, injection molding is conducted with a resin of plating grade, the whole surface of the resultant article is roughened, and a catalyst is then coated to form a plating film. The formation of the plating film is generally conducted by electroless plating or electroless plating and electroplating subjected thereon. A pattern is then formed on the plating film by photolithography using a resist to form a circuit. Examples of a method for forming the circuit include a subtractive method using an etching resist and a semi-additive method using a plating resist. It may also be possible that after a plating film is formed on the whole surface of the article, unnecessary portions of the plating film are removed by laser abrasion to form the circuit.

As another production process of MID, a platable resin is molded to produce an article for three-dimensional circuit, and a catalyst is applied to the surface of the article. A hardly platable resin is arranged on a portion of the article, on which plating is unnecessary, by molding to produce an integral article. Lastly, the catalyst-coated portion is plated by a full-additive method to form a circuit. The hardly platable resin integrally molded plays a role of a plating resist upon the plating.

As described above, MID is such that a circuit (conductive pattern) is formed on the surface of an article molded from a thermoplastic resin or thermosetting resin utilizing a wet plating process such as electroless plating or electroplating. MID is a wiring board having a function as a structure member or mechanical part and a function as a wiring member in combination. Since a resin article is produced by a melt molding process such as an injection molding process, the form of the article can be freely designed, and the article is also excellent in productivity. In addition, since the plating layer can be formed on any surface of the article, the circuit can be three-dimensionally formed, and so it is convenient for MID to use as a package for a semiconductor chip.

MID can be not only utilized as a package for a semiconductor chip, but also integrally combined with peripheral circuit parts and mechanical parts into one part, so that it has a merit that compact and rational mounting design becomes feasible. Therefore, MID is intended to develop its uses in a wide variety of fields such as package cases for electronic device parts, wire-rationalized products and adaptors for hybrid IC.

Even in MID, as with the printed wiring board, surface-mounting parts such as semiconductor chip parts and flat package ICs are soldered by reflow soldering. In the surface mounting by the reflow soldering, after printing is conducted in advance on a land (pad) with solder paste, electrodes of semiconductor chip parts, or the like are mounted thereon, and finally the solder paste is melted by means of a reflow oven to conduct the soldering.

Accordingly, MID is required to have heat resistance (namely, reflow resistance) that can withstand the mounting by reflow soldering. More specifically, MID is required to have high heat resistance to the extent that it is not deformed at a temperature of at least 240° C., preferably about 260° C. Therefore, as a resin material making up MID, is used a super engineering plastic such as a liquid crystal polymer (LCP).

As a process for forming a plating layer on the surface of an LCP article, is adopted, for example, (1) a process that after a resin material with an inorganic filler dispersed in LCP is injection-molded, and the resultant article is etched with an aqueous solution of sodium hydroxide to form fine irregularities in the surface thereof, a palladium catalyst is carried on the irregularities to grow a plating layer formed of copper, nickel, gold or the like thickly by only electroless plating, or (2) a process that after a thin plating layer is formed on the surface of the article by electroless plating, the plating layer is grown thickly by electroplating. The thickness of the plating layer is generally designed to about 5 to 30 μm from the viewpoint of conductor resistance. The fine irregularities formed in the LCP article become anchor holes for the plating layer and play a role of ensuring the adhesion strength of the plating layer to the surface of the article.

The adhesion strength of the plating layer is measured in accordance with, for example, a method illustrating in FIG. 1. A metal wire 4 having a diameter φ of 1.5 mm is vertically stood on a plating layer 2 formed on the surface of an article 1, and one end of the metal wire 4 is soldered. The diameter φ and height of a soldered joint 3 are set to 4 mm and 2 mm, respectively. The other end of the metal wire 4 is pulled at a crosshead speed of 10 mm/min to peel the plating layer 2 in a direction perpendicular to the surface of the plating layer 2 through the soldered joint 3, thereby measuring peel strength at this time. The adhesion strength between the article and the plating layer is required to indicate at least 2 MPa by the above-described test method from the viewpoint of reliability.

In the application to the above-described semiconductor package or the like, of which wire bonding is required, the surface roughness of the plating layer is required to have high smoothness of at most 1 μm in terms of arithmetic mean roughness Ra. If the smoothness of the plating layer surface is poor, in some cases, the bonding strength of a bonding wire may be lowered, and the bonding may become unstable or further infeasible.

In the conventional LCP article, however, it has been extremely difficult to satisfy the adhesion strength between the article and the plating layer and the smoothness of the plating layer surface at the same time. When the etching time of the LCP article is shortened to make the fine irregularities formed therein small, the smoothness of the plating layer surface can be improved to lower the arithmetic mean roughness Ra to 1 μm or lower. However, its adhesion strength is greatly lowered to fail to ensure the adhesion strength of at least 2 MPa. On the other hand, when the etching time of the LCP article is lengthened to make the fine irregularities formed therein large, the adhesion strength of the plating layer can be enhanced, but the smoothness of the plating layer is impaired.

From the reasons described above, there has not yet been realized any article having smoothness of at most 1 μm in terms of arithmetic mean roughness Ra and adhesion strength of at least 2 MPa to the article in combination and additionally having reflow resistance by which mounting by reflow soldering becomes feasible, and there has been a demand for development of a material and a process that can produce such an article.

In addition, electronic apparatus such as household appliance and business equipment are flame-retarded in such a manner that wiring boards incorporated therein are neither fired nor burned. Therefore, a wiring board used in an electronic apparatus is required to have flame retardancy. As the specific degree of the flame retardancy, high flame retardancy that satisfies a severe standard value like V-0 prescribed in UL-94 (Flammability test of plastic materials for parts in devices and appliances) of UL standard (Underwriters' Laboratories, Inc. Standard) is required. Accordingly, there is a demand for articles such as MID, which can be highly flame-retarded as needed, in addition to the fact that they have such properties as described above.

DISCLOSURE OF THE INVENTION

It is an object of the present invention to provide a plated-synthetic resin article which is excellent in surface smoothness and adhesion of its plating layer, has high heat resistance and can be flame-retarded as needed and a production process thereof.

The present inventors have carried out an extensive investigation with a view toward solving the above-described problems. As a result, it has been found that a resin composition obtained by dispersing an inorganic filler having an average particle diameter of 1 to 10 μm in a specific proportion in a polyester resin, which can be crosslinked by irradiation with ionizing radiation, is used to mold a polyester article, a plating layer is formed on the surface of the polyester article, and the ionizing radiation is irradiated before or after the formation of the plating layer to crosslink the polyester resin, thereby providing a plated-polyester article having a plating layer that the arithmetic mean roughness Ra of the surface of the plating layer is at most 1 μm, and adhesion strength between the plating layer and the article is at least 2 MPa, and also satisfying reflow resistance of 240 to 260° C. The present invention has been led to completion on the basis of these findings.

According to the present invention, there is thus provided a plated-polyester article comprising a polyester article (A) and a plating layer (B) formed on the surface of the article, wherein (1) the polyester article (A) is irradiated with ionizing radiation to crosslink a polyester resin, (2) the arithmetic mean roughness Ra of the surface of the plating layer (B) is at most 1 μm, and (3) adhesion strength between the polyester article (A) and the plating layer (B) is at least 2 MPa.

According to the present invention, there is also provided a production process of a plated-polyester article with a plating layer (B) formed on the surface of a polyester article (A), which comprises (I) Step 1 of melt-molding a resin composition obtained by dispersing an inorganic filler having an average particle diameter of 1 to 10 μm in a proportion of 5 to 20 vol. % in a polyester resin, which can be crosslinked by irradiation with ionizing radiation, into a polyester article (A) having a desired shape, (II) Step 2 of forming a plating layer (B) on the surface of the polyester article (A), and (III) Step 3 of irradiating the polyester article (A) with the ionizing radiation before or after Step 2 to crosslink the polyester resin.

BEST MODE FOR CARRYING OUT THE INVENTION

Figure 1:
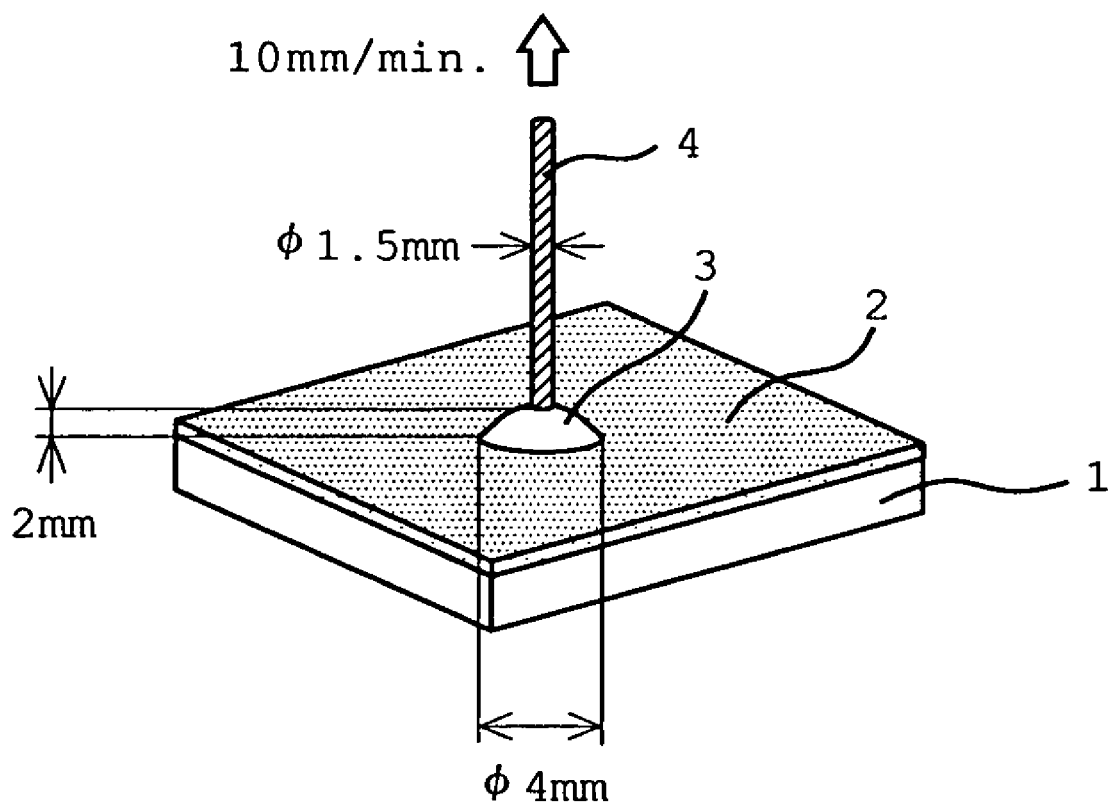
FIG. 1 is a perspective view illustrating a method for measuring the adhesion strength of a plating layer to an article

1. Polyester Resin Crosslinkable by Irradiation:

In the present invention, a polyester resin crosslinkable by irradiation with ionizing radiation is used. As examples of polyester resins, may be mentioned polybutylene terephthalate (PBT), polyethylene terephthalate (PET), polybutylene naphthalate (PBN), polyethylene naphthalate (PEN), polycyclohexylene terephthalate (PCT), polycyclohexylene terephthalate-polyethylene terephthalate copolymers (PCT-PET), polycyclohexylene dimethylterephthalate-isophthalate copolymers (PCTA) and polybutylene succinate (PBS). These polyester resins may be used either singly or in any combination thereof.

These polyester resins may be converted into polyester resins crosslinkable by irradiation with ionizing radiation in accordance with, for example, the following methods (1) to (4).

(1) A method of Incorporating a Polyfunctional Monomer:

A polyfunctional monomer is incorporated into such a polyester as described above, whereby a polyester resin (composition) crosslinkable by irradiation with ionizing radiation can be obtained.

Examples of the polyfunctional monomer include diacrylates such as diethylene glycol diacrylate; dimethacrylates such as ethylene glycol dimethacrylate and dipropylene glycol dimethacrylate; triacrylates such as trimethylolethane triacrylate and trimethylolpropane triacrylate; trimethacrylates such as trimethylolethane trimethacrylate and trimethylolpropane trimethacrylate; and (iso)cyanulates such as triallyl cyanulate and triallyl isocyanulate.

Among these polyfunctional monomers, triallyl isocyanulate and trimethylolpropane trimethacrylate are preferred.

The polyfunctional monomer is used in a proportion of generally 0.1 to 20 parts by weight, preferably 0.5 to 15 parts by weight, more preferably 1 to 10 parts by weight per 100 parts by weight of the polyester resin. If the amount of the polyfunctional monomer incorporated is too little, the degree of crosslinking may become insufficient in some cases even when ionizing radiation is irradiated. When the crosslinking is insufficient, the resulting article is difficult to satisfy the reflow resistance. If the amount of the polyfunctional monomer incorporated is too great, its melt mixing with the polyester resin becomes difficult, and moreover burr occurs to a great extent upon molding. It is hence not preferable to use the polyfunctional monomer in such a too little or great amount.

(2) A Method Of Introducing a Polymerizable Functional Group:

A polyester resin is reacted with a polyfunctional organic compound to introduce a polymerizable functional group into the polyester resin, whereby a modified polyester resin crosslinkable by irradiation with ionizing radiation can be obtained.

As the polyfunctional organic compound, is used an organic compound having a polymerizable functional group such as a vinyl, allyl, acryloyl or methacryloyl group and a functional group such as an amino, hydroxyl, epoxy (glycidyl), carboxyl acid or acid anhydride group in the same molecule.

As examples of such polyfunctional organic compounds, may be mentioned glycidyl acrylate, glycidyl methacrylate, acryl glycidyl ether, 2-methylallyl glycidyl ether, p-glycidylstyrene, glycidyl ether of o-, m- or p-allylphenol, 3,4-epoxy-1-butene, 3,4-epoxy-3-methyl-1-butene, 3,4-epoxy-1-pentene, 5,6-epoxy-1-hexene, crotonic acid, maleic anhydride, crotonic anhydride, undecylenic acid, β-methacryloyloxyethyl hydrogensuccinate, 2-hydroxyethyl acrylate, 2-hydroxyethyl methacrylate, 3-hydroxypropyl acrylate, 3-hydroxypropyl methacrylate, propylene glycol monoacrylate, propylene glycol monomethacrylate, allyl alcohol, dimethylaminoethyl methacrylate and tert-butylaminoethyl methacrylate.

These polyfunctional organic compounds may be used either singly or in any combination thereof. Among these, glycidyl methacrylate and β-methacryloyloxyethyl hydrogensuccinate are preferred.

The reaction of the polyester resin with the polyfunctional organic compound is preferably conducted by a method of melt-mixing both components. Upon the melt mixing, other additive components may also be mixed together with them.

The polyfunctional organic compound is used in a proportion of generally 0.1 to 20 parts by weight, preferably 0.5 to 15 parts by weight, more preferably 1 to 10 parts by weight per 100 parts by weight of the polyester resin. If the amount of the polyfunctional organic compound used is too little, the degree of crosslinking by irradiation with ionizing radiation may become insufficient in some cases. If the amount of the polyfunctional organic compound used is too great, its melt mixing with the polyester resin becomes difficult, and moreover burr occurs to a great extent upon molding. It is hence not preferable to use the polyfunctional organic compound in such a too little or great amount.

(3) A Method of Introducing a Carbon-carbon Double Bond in a Main Chain:

In a polymerization step of the polyester resin, an unsaturated diol or unsaturated dicarboxylic acid is copolymerized to synthesize a polyester resin having a carbon-carbon double bond in its main chain, whereby a modified polyester resin crosslinkable by irradiation with ionizing radiation can be obtained.

As example of the unsaturated diol, may be mentioned 2-butene-1,4-diol. As examples of the unsaturated carboxylic acid, may be mentioned unsaturated aliphatic dicarboxylic acids such as fumaric acid, maleic acid, itaconic acid and citraconic acid, alkyl esters thereof, and acid anhydrides thereof.

These unsaturated diols or unsaturated carboxylic acids are used in a proportion of generally 1 to 20 mol %, preferably 1 to 10 mol % based on the diol component or dicarboxylic acid component. If the proportion of the unsaturated diol or unsaturated dicarboxylic acid copolymerized is too low, the degree of crosslinking by irradiation with ionizing radiation becomes insufficient, and so it is difficult to achieve sufficient heat resistance. If the proportion is too high, the melting point of the resulting polyester resin may be lowered in some cases to lower its heat resistance. Both unsaturated diol and unsaturated dicarboxylic acid may be used in combination.

(4) A Method of Combining the Above-described Methods:

A method of combining at least 2 of the above-described methods (1) to (3) may also be adopted.

As a preferable method thereof, is mentioned a method of combining the method (2) or (3) with the method (1). For example, a method that the polyfunctional monomer is incorporated into the modified polyester resin obtained by introducing the polymerizable functional group by the method (2) is mentioned as a preferable method.

2. Inorganic Filler:

As examples of the inorganic filler, may be mentioned calcium pyrophosphate, ground silica, spherical silica, clay, talc, mica, calcium carbonate, magnesium carbonate and titanium oxide. The form of the inorganic filler may be any of spherical, amorphous, whisker and other forms. Among the above-described fillers, calcium pyrophosphate, ground silica and spherical silica are preferred from the viewpoints of melt-flowability of the resulting resin composition and mechanical strength of the resulting article. These inorganic fillers may be used either singly or in any combination thereof.

The average particle diameter of the inorganic filler is 1 to 10 µm, preferably 2 to 8 µm, more preferably 2 to 6 µm. The average particle diameter of the inorganic filler may be measured in accordance with a method known per se in the art, such as a laser diffraction/scattering method.

If the average particle diameter of the inorganic filler is too small, such an inorganic filler tends to aggregate in the polyester resin, so that surface roughness after the surface of the resulting article is subjected to an etching treatment is liable to be rather rough. When the inorganic filler aggregates in the polyester resin, the surface roughness Ra of the plating layer exceeds 1 µm, so that it is difficult to conduct wire bonding. Further, if the average particle diameter of the inorganic filler is too small, the adhesion strength of the plating layer becomes small even when the surface roughness Ra of the plaiting layer can be controlled to 1 μm or small. If the average particle diameter of the inorganic filler is too great on the other hand, the surface roughness Ra of the plaiting layer exceeds 1 μm, and the wire-bonding ability thereof is deteriorated.

The amount of the inorganic filler added is 5 to 20 vol. %, preferably 7 to 18 vol. %, more preferably 10 to 15 vol. % based on the total volume of the resin composition. If the proportion of the inorganic filler added is too low, the adhesion strength between the resulting article and the plating layer is lowered. If the proportion is too high, surface roughness after the surface of the resulting article is subjected to an etching treatment becomes great. As a result, the surface roughness Ra of the plaiting layer exceeds 1 μm, and the wire-bonding ability thereof is deteriorated.

The present inventors have carried out an investigation as to the cause that difficulty is encountered on making the Ra of the plating layer formed on the surface of the LCP article by a wet plating process such as electroless plating 1 μm or smaller. As a result, the cause has been found out to be attributable to the fact that the inorganic filler does not uniformly disperse in the LCP, but aggregates.

The dispersion of the inorganic filler in the LCP is conducted by melt mixing. However, since the melt viscosity of the LCP rapidly lowers when it is melted, shearing force applied upon the melt mixing is hard to be transmitted to the inorganic filler. As a result, the inorganic filler tends to aggregate. Since the inorganic filler aggregated from the surface of the LCP article becomes lump and falls off upon the etching, the irregularities becomes deep. As a result, the surface roughness Ra of the plating layer to be formed also becomes great. When the conditions of the etching treatment are relaxed to make the surface roughness of the LCP article small, the adhesion strength of the resulting plating layer is markedly lowered.

On the other hand, the polyester resin crosslinkable by irradiation with ionizing radiation does not rapidly lower its melt viscosity unlike the LCP even when it is heated in a molten state, and so the inorganic filler can be uniformly dispersed by the shearing force upon the melt mixing. As a result, irregularities of the size corresponding to the particle diameter of the inorganic filler dispersed can be formed in the surface of the article by etching. Therefore, the surface roughness Ra of the plating layer formed thereon is greatly improved compared with the LCP article, and moreover the adhesion strength of the plating layer becomes high. In other words, according to the present invention, there can be provided a plated-polyester article having, in combination, both properties that the arithmetic mean roughness Ra of a plating layer is at least 1 μm, and the adhesion strength between the article and the plating layer is at least 2 MPa.

3. Other Additives:

Into the resin composition used in the present invention, may be incorporated various kinds of additives such as flame retardants, colorants, lubricants, other inorganic fillers, reinforcing materials such as glass fiber and whisker, antioxidants, hydrolysis inhibitors and processing stabilizer, as needed. Accordingly, the plated-polyester articles according to the present invention may contain these additives.

When the plated-polyester article is flame-retarded, it is only necessary to incorporate a flame retardant into the resin composition upon the production of the polyester article (A). In order to achieve high flame retardancy by adding the flame retardant in a relatively small amount, a bromine flame retardant is preferably used.

Examples of the bromine flame retardant include ethylene bistetrabromophthalimide, ethylene bispentabromo-diphenyl, tetrabromophthalic anhydride, tetrabromo-phthalimide, tetrabromobisphenol A, tetrabromobisphenol A-bis(hydroxyethyl ether), tetrabromobisphenol A-bis(2,3-dibromopropyl ether), tetrabromobisphenol A-bis(bromoethyl ether), tetrabromobisphenol A-bis(allyl ether), tetrabromobisphenol A carbonate oligomers, tetrabromo-bisphenol A epoxy oligomers, tetrabromobisphenol S, tetrabromobisphenol S-bis(hydroxyethyl ether), tetrabromobisphenol S-bis(2,3-dibromopropyl ether), brominated polystyrene, brominated poly(phenylene ether), brominated polycarbonate, brominated epoxy resins, brominated polyester, brominated acrylic resins, brominated phenoxy resins, hexabromobenzene, pentabromoethylbenzene, decabromodiphenyl, hexabromodiphenyl oxide, octabromo-diphenyl oxide, decabromodiphenyl oxide, polypentabromo-benzyl acrylate, octabromonaphthalene, hexabromo-cyclododecane, bis(pentabromophenyl)ethane, bis(tribromophenyl)fumarimide and N-methylhexabromo-diphenylamine.

These bromine flame retardants may be used either singly or in any combination thereof. Among these, ethylenebistetrabromophthalimide, bis(pentabromophenyl)-ethane, tetrabisphenol A carbonate oligomers, brominated polystyrene and brominated poly(phenylene ether) are preferred, with ethylenebistetrabromophthalimide being particularly preferred in that the resulting resin composition undergoes little change of melt viscosity with time upon injection molding.

The bromine flame retardant is incorporated in a proportion of generally 10 to 50 parts by weight, preferably 15 to 45 parts by weight per 100 parts by weight of the polyester resin. When the bromine flame retardant is incorporated within the above-describer range, flame retardancy satisfying the standard value V-0 in the UL-94 test can be achieved. If the amount of the bromine flame retardant incorporated is too little, it is difficult to achieve flame retardancy satisfying the standard value V-0 in the UL-94 test. If the amount of the bromine flame retardant incorporated is too great, the resulting injection-molded article tends to cause defects such as burr.

Inorganic flame retardants or flame retardant auxiliaries such as antimony trioxide, antimony pentoxide, zinc stannate, zinc hydroxystannate and zinc borate; phosphorus flame retardants such as red phosphorus and phosphates; chlorine flame retardants such as perchloro-pentacyclodecane; and/or the like may be suitably incorporated together with the bromine flame retardants as needed.

4. Plated-polyester Article and Production Process Thereof:

The plated-polyester article with a plating layer (B) formed on the surface of a polyester article (A) can be produced in accordance with a production process including the following Steps (I) to (III):

(I) Step 1 of melt-molding a resin composition obtained by dispersing an inorganic filler having an average particle diameter of 1 to 10 μm in a proportion of 5 to 20 vol. % in a polyester resin, which can be crosslinked by irradiation with ionizing radiation, into a polyester article (A) having a desired shape, (II) Step 2 of forming a plating layer (B) on the surface of the polyester article (A), and (III) Step 3 of irradiating the polyester article (A) with the ionizing radiation before or after Step 2 to crosslink the polyester resin.

No particular limitation is imposed on a method for preparing the resin composition in Step 1, but a method of melt-mixing the respective components is generally adopted. In the melt mixing, may be used an already known mixing equipment such as an extruder type mixer such as a single-screw mixer or twin-screw mixer, or an intensive type mixer such as a Banbury mixer or pressure kneader. It is preferred that the respective components be melt-mixed by means of an extruder type melt-mixing equipment to form pellets. When the extruder type melt-mixing equipment is used, the respective components are preferably premixed by means of a mixer or the like.

As a molding or forming method of the resin composition in Step 1, may be adopted any method such as injection molding, extrusion or compression molding. In order to apply the plated-polyester article to an electronic part such as MID, it is preferred to adopt injection molding.

The shape of the polyester article (A) may be suitably determined as necessary for the end application intended. A layer composed of the polyester article (A) may also be formed on the surface of a base such as another synthetic resin article. Alternatively, a hardly platable resin article may also be integrally formed on the surface of the polyester article (A) according to pattern.

As a method for forming the plating layer (B) on the surface of the polyester article (A) in Step 2, is preferred a method that electroless plating is conducted in accordance with a method known per se in the art. As the electroless plating, is preferred electroless copper plating.

In order to conduct the electroless plating, the surface is treated by the respective steps of (1) pre-dipping (preventing washing water from being carried in a catalyst solution), (2) formation of a catalyst using a solution containing a tin chloride, palladium chloride, sodium chloride or the like, (3) accelerator and (4) electroless copper plating.

For example, a copper ion source (for example, copper sulfate), a complexing agent (for example, ethylenediaminetetraacetic acid; EDTA), a reducing agent (for example, formaldehyde), a pH adjustor (for example, NaOH) and an additive (for example, dipyridyl) are representative of a composition of the electroless copper plating. As an electroless copper plating solution, may be used a commercially available product.

After the electroless plating, electroplating such as copper electroplating may be conducted. As the electroplating, may be adopted a method that a negative electrode and a positive electrode are inserted into an aqueous solution with a metal to be deposited dissolved therein in accordance with a method known per se in the art, and a direct current is applied to generally deposit the metal on a substrate on the negative electrode.

A plating layer having a thickness proper for a circuit may be formed by only the electroless plating, but the electroless plating and electroplating may also be used in combination to form a thick plating layer. Additionally, the surface of the copper plating layer may be subjected to gold plating with a primer by nickel plating. The nickel plating and gold plating may be respectively conducted by any of electroplating and electroless plating.

The thickness of the plating layer may be determined as necessary for the end application intended. However, the thickness of the electroless plating layer is of the order of generally 0.3 to 10 μm, preferably 0.5 to 5 μm. The thickness of the electroplating layer is of the order of generally 1 to 30 μm, preferably 3 to 20 μm. As described above, however, the plating layer having a thickness proper for a circuit may be formed by only the electroless plating.

In the present invention, no particular limitation is imposed on the order of the plating treatment and the crosslinking treatment by irradiation with ionizing radiation. The crosslinking may be conducted by irradiation with ionizing radiation after the plating treatment, but the plating treatment may also be conducted after the crosslinking is conducted by irradiation with ionizing radiation. Step 3 of crosslinking by irradiation with ionizing radiation is preferably arranged after Step 2 of forming the plating layer from the viewpoints of easiness of the plating treatment step, adhesion strength of the plating layer and the like.

In Step 3, the polyester article (A) is irradiated with ionizing radiation to crosslink the polyester resin. As examples of the ionizing radiation, may be mentioned electron rays (beta rays), gamma rays, alpha rays and ultraviolet rays. Among these, electron rays are particularly preferred from the viewpoints of, for example, easy use of radiation source and rapidity of the crosslinking treatment. When the crosslinking by irradiation is conducted after the plating layer is formed on the surface of the polyester article (A), it is preferred to use accelerated electron rays or gamma rays from the relation with the transmission thickness.

An exposure dose is within a range of preferably 50 to 500 kGy, more preferably 100 to 300 kGy. If the exposure dose is too low, the reflow resistance of the resulting crosslinked polyester article becomes insufficient. If it is too high, the polyester resin forming the article has a possibility of incurring decomposition.

The plated-polyester article according to the present invention is that with the plating layer (B) formed on the surface of the polyester article (A). The arithmetic mean roughness Ra of the surface of the plating layer (B) is at most 1 μm, and the adhesion between the polyester article (A) and the plating layer (B) is at least 2 MPa. The arithmetic mean roughness Ra of the plating layer surface can be measured by means of a confocal microscope. The lower limit of the arithmetic mean roughness Ra of the surface of the plating layer (B) is generally 0.1 μm, often 0.2 μm. The upper limit of the adhesion strength between the polyester article (A) and the plating layer (B) is generally 20 MPa, often 15 MPa.

The plated-polyester articles according to the present invention are excellent in reflow resistance. More specifically, when the polyester article (A) according to the present invention is evaluated on the reflow resistance under conditions that it is passed through a zone preset to 260° C. in a reflow oven in 60 seconds, the rates of its changes in dimensions come to at most 1% in both longitudinal and crosswise directions. Accordingly, the plated-polyester article of the present invention obtained by forming the plating layer (B) on the surface of the polyester article (A) does not cause defects such as blister of the plating layer in the step of reflow soldering.

By containing a flame retardant in the polyester article (A), the plated-polyester articles according to the present invention can achieve flame retardancy satisfying the standard value V-0 in the UL-94 test without impairing the surface smoothness and adhesion strength of the plating layer, and reflow resistance.

EXAMPLES

The present invention will hereinafter be described more specifically by the following examples and comparative examples. However, the present invention is not limited to these examples alone.

Example 1

1. Preparation of Polyester Resin Composition:

Polybutylene terephthalate and glycidyl methacrylate were mixed and reacted with each other, thereby obtaining a modified polybutylene terephthalate crosslinkable by irradiation with ionizing radiation, and a polyfunctional monomer, an inorganic filler and an antioxidant were incorporated into the modified polybutylene terephthalate to prepare a resin composition.

More specifically, 100 parts by weight of polybutylene terephthalate (PBT), 5 parts by weight of glycidyl methacrylate, 3 parts by weight of triallylisocyanurate, 30 parts by weight of calcium pyrophosphate (average particle diameter: 6 μm) and 0.1 parts by weight of an antioxidant were charged into a super mixer having a volume of 20 liters to premix them at room temperature. Pellets of the polyester resin composition were prepared in accordance with a process that the premix thus obtained is charged into a twin-screw extruder (diameter φ: 45 mm, L/D=32) and melt-mixed at a temperature of 260° C. and a screw speed of 100 rpm, the resultant melt is extruded from a die into a strand, and the extruded strand is cut under cold water.

2. Reflow Resistance Test and Production of Sample:

The above-described pellets were subjected to injection molding by means of an injection molding machine having clamping force of 40 t under conditions of a barrel temperature of 260° C., an injection pressure of 500 kg/cm$^2$, injection time of 10 seconds and a mold temperature of 60° C. to form a plate having a length of 30 mm, a width of 10 mm and a thickness of 0.4 mm. The plate thus obtained was irradiated with 200 kGy of electron rays at accelerating voltage of 3 MeV to produce a sample for reflow resistance test.

In the reflow resistance test, the sample for test was evaluated in accordance with a process that the sample is passed through a zone preset to 260° C. in a reflow oven in 60 seconds to determine rates of its changes in dimensions. When the rates of changes in dimensions are at most 1% in both longitudinal and crosswise directions, the sample can be evaluated as having good reflow resistance.

3. Production of Sample for Evaluation on Plating:

The above-described pellets were subjected to injection molding by means of an injection molding machine having clamping force of 40 t under conditions of a barrel temperature of 260° C., an injection pressure of 500 kg/cm$^2$, injection time of 10 seconds and a mold temperature of 60° C. to form a plate having a length of 20 mm, a width of 20 mm and a thickness of 1 mm. After the plate thus obtained was immersed for 12 minutes in an 45% aqueous solution of sodium hydroxide at 85° C. to etch it, it was neutralized with 4% hydrochloric acid and then sufficiently washed with water. The surface of this plate was subjected to plating treatments such as electroless copper plating and copper electroplating in accordance with the following respective procedures and then irradiated with 200 kGy of electron rays at accelerating voltage of 3 MeV. Plating layers were formed on the surface in such a manner to produce a sample for evaluation on plating that was irradiated with the ionizing radiation to crosslink the polyester resin.

i) Electroless Copper Plating:

(1) Conditioning:

After the plate produced above was immersed for 5 minutes at 45° C. in an aqueous solution containing Neutralizer 3320 (product of SHIPLEY FAR EAST K.K.) at a concentration of 100 ml/liter, it was washed with ion-exchanged water.

(2) Pre-Dipping:

The plate was dipped for 3 minutes at room temperature in an aqueous solution containing 180 g/little of sodium chloride, 80 ml/little of 35% hydrochloric acid and 20 ml/liter of Omnishield 1505 (product of SHIPLEY FAR EAST K.K.).

(3) Catalyst:

The plate was immersed for 15 minutes at 45° C. in an aqueous solution containing 180 g/little of sodium chloride, 100 ml/little of 35% hydrochloric acid, 20 ml/liter of Omnishield 1505 and 20 ml/liter of Omnishield 1558 (product of SHIPLEY FAR EAST K.K.) and then washed with ion-exchanged water.

(4) Accelerator:

The plate was immersed for 5 minutes at room temperature in an aqueous solution containing 100 ml/liter of Omnishield 1560 (product of SHIPLEY FAR EAST K.K.) and then washed with ion-exchanged water.

(5) Electroless Copper Plating:

The plate was immersed for 20 minutes at 45° C. in an aqueous solution containing 100 ml/liter of Omnishield 1598 (product of SHIPLEY FAR EAST K.K.) to form a copper plating layer having a thickness of 0.5 μm.

ii) Copper Electroplating:

An electric current of a current density of 2.5 A/dm$^2$ was passed for 23 minutes through the plate, on which the electroless copper plating layer had been formed, in an aqueous solution containing 80 g/liter of copper sulfate pentahydrate, 200 ml/liter of sulfuric acid, 147 μl of 35% hydrochloric acid and 10 ml/liter of THRU-CUP ETN (product of Uyemura Co., Ltd.) to form a copper electroplating layer having 10 μm.

iii) Electroless Nickel Plating:

The copper plating layer was additionally subjected to an electroless nickel plating treatment in accordance with the following procedure.

(1) Degreasing:

The plate was immersed for 5 minutes at 50° C. in an aqueous solution containing 100 ml/liter of Preposit Cleaner 742 (product of SHIPLEY FAR EAST K.K.) and washed with ion-exchanged water.

(2) Etching of Copper:

The plate was dipped for 1 minute at room temperature in an aqueous solution containing 10 ml/liter of sulfuric acid, 60 ml/liter of Preposit Etch 748 (product of SHIPLEY FAR EAST K.K.) and washed with ion-exchanged water.

(3) Washing with Acid:

The plate was dipped for 1 minute at room temperature in a 10% aqueous solution of sulfuric acid and then washed with ion-exchanged water.

(4) Catalyst:

After the plate was dipped for 30 seconds at room temperature in 6% hydrochloric acid, it was dipped for 1 minute at room temperature in an aqueous solution containing 9 ml/little of 35% hydrochloric acid and 6 ml/liter of Omnishield 1573 (product of SHIPLEY FAR EAST K.K.) and then washed with ion-exchanged water.

(5) Electroless Nickel Plating:

The plate was immersed for 30 minutes at 85° C. in an aqueous solution containing 310 ml/liter of Everon BM2 (product of SHIPLEY FAR EAST K.K.) to form a nickel plating layer having a thickness of 5 μm.

iv) Gold plating:

The nickel plating layer was additionally subjected to a gold plating treatment in accordance with the following procedure.

(1) Electroless Strike Plating:

The plate was immersed for 10 minutes at 90° C. in an aqueous solution containing 3 g/liter of gold potassium cyanide and 500 ml/liter of Aurolectroless SMT210 (product of Nippon Lea Ronal K.K.).

(2) Electroless Gold Plating:

The plate was immersed for 60 minutes at 85° C. in an aqueous solution containing 6 g/liter of gold potassium cyanide and 750 ml/liter of Aurolectroless SMT301 (product of Nippon Lea Ronal K.K.) to form a gold plating layer having a thickness of 0.5 μm.

4. Measurement of Surface Roughness of Plating Layer:

In the measurement of the surface roughness of the plating layer, a confocal microscope (VK8550 manufactured by KEYENCE CORPORATION) was used to find arithmetic mean roughness Ra of the plating layer surface. The surface roughness was evaluated as good where Ra was 1 μm or smaller in view of wire-bonding ability.

5. Measurement Adhesion Strength of Plating Layer:

The measurement of the adhesion strength of the plating layer was conducted in accordance with the method illustrating in FIG. 1. More specifically, a metal wire 4 having a diameter φ of 1.5 mm was vertically stood on a plating layer 2 formed on the surface of an article 1, and one end of the metal wire 4 was soldered to the plating layer 2. The diameter φ and height of a soldered joint 3 were set to 4 mm and 2 mm, respectively. The other end of the metal wire 4 was pulled at a crosshead speed of 10 mm/min to peel the plating layer 2 in a direction perpendicular to the surface of the plating layer 2 at the soldered joint 3, thereby measuring peel strength at this time. When the adhesion strength of the plating layer is at least 2 MPa, it can be evaluated as good.

6. Wire Bonding Test:

Wire bonding was conducted by FB118A (manufactured by KAIJO CORPORATION), and a bonding tool, 1573-15-437GM-20D (manufactured by KAISER TOOL JAPAN Co., Ltd.) and an Au wire NL5 (product of Sumitomo Metal Mining Co., Ltd.) were used. The bonding was performed under conditions of a heating temperature of 100° C. and a frequency of ultrasonic wave (US) of 100 kHz, and a bonding load, US time and US power were preset to 30 g, 30 ms and 40 on the first side, and 60 g, 60 ms and 100 on the second side, respectively. Whether bonding ability wad good or not was judged on the basis of the fact that bonding can be continuously conducted at least 100 times, and the bond strength of the bonding wire at 100 shots is at least 40 g in terms of peel strength under shear on the first side or at least 6 g in terms of tensile peel strength on the neck side of the second side.

7. Evaluation on Circuit-forming Ability:

After completion of the electroless copper plating, a circuit of L/S (line/space)=100/100 μm was formed on the sample for evaluation on plating by laser abrasion. The formation of the circuit by the laser abrasion was conducted by removing portions that plating is unnecessary by the fundamental wavelength (1,064 nm) and second harmonic (532 nm) of YAG laser, and excimer laser (248 nm). A sample that a circuit, whose tolerance of a circuit width was ±10 μm or smaller, was able to be formed was evaluated as having good circuit-forming ability.

Examples 2 to 4

Respective samples were produced in the same manner as Example 1 except that calcium pyrophosphate (Example 2) having an average particle diameter of 2 μm, ground silica (Example 3) having an average particle diameter of 2 μm or spherical silica (Example 4) having an average particle diameter of 2 μm were used in place of calcium pyrophosphate having an average particle diameter of 6 μm, and evaluated in the same manner as described above. The results are shown in Table 1.

Examples 5 and 6

Examples 5 and 6 are experimental examples making use of respective resin compositions that a flame retardant was added, and the inorganic filler having an average particle diameter within a range of 1 to 10 μm was dispersed in a proportion of 15 vol. % in the resin composition as shown in Table 1. Respective samples were produced in the same manner as in Example 1 except that these resin compositions were respectively used, and evaluated in the same manner as described above. The flame retardancy was evaluated in accordance with UL94 flammability test. The results are shown in Table 1.

TABLE 1

| | Example | | | | | |
|---|---|---|---|---|---|---|
| | 1 | 2 | 3 | 4 | 5 | 6 |
| PBT (*1) | 100 | 100 | 100 | 100 | 100 | 100 |
| Glycidyl methacrylate | 5 | 5 | 5 | 5 | 5 | 5 |
| Triallyl isocyanulate | 3 | 3 | 3 | 3 | 3 | 3 |
| Calcium pyrophosphate (average particle diameter: 6 μm) | 30 | — | — | — | — | — |
| Calcium pyrophosphate (average particle diameter: 2 μm) | — | 30 | — | — | 50 | — |
| Ground silica (average particle diameter: 2 μm) | — | — | 20 | — | — | — |
| Spherical silica (average particle diameter: 5 μm) | — | — | — | 20 | — | 35 |
| Flame retardant (*2) | — | — | — | — | 20 | 20 |
| Antimony trioxide | — | — | — | — | 5 | 5 |
| Antioxidant (*3) | 0.1 | 0.1 | 0.1 | 0.1 | 0.1 | 0.1 |
| Proportion of inorganic filler in resin composition (vol. %) | 10 | 10 | 10 | 10 | 15 | 15 |
| Exposure dose of electron rays (kGy) | 250 | 250 | 250 | 250 | 250 | 250 |
| Time of etching treatment (min) | 12 | 12 | 12 | 12 | 12 | 12 |
| Reflow resistance (rates of changes in dimensions) | | | | | | |
| Longitudinal direction | 0.9 | 0.7 | 0.7 | 0.7 | 0.8 | 0.6 |
| Crosswise direction | 0.5 | 0.4 | 0.3 | 0.3 | 0.4 | 0.3 |

TABLE 1-continued

|  | Example | | | | | |
|---|---|---|---|---|---|---|
|  | 1 | 2 | 3 | 4 | 5 | 6 |
| Surface roughness of plating layer (Ra) | 0.4 | 0.5 | 0.6 | 0.4 | 0.5 | 0.5 |
| Adhesion strength of plating layer (MPa) | 2.3 | 4.2 | 4.2 | 3.1 | 6.1 | 9.3 |
| Wire bonding strength (g) | | | | | | |
| First side | 75.5 | 87.0 | 77.1 | 85.3 | 75.6 | 82.6 |
| Second side | 8.7 | 10.2 | 8.4 | 11.3 | 8.3 | 10.5 |
| Result of UL94 test | — | — | — | — | V0 | V0 |

(Note)
(*1) TORAYCON 1401X06, trade name, product of Toray Industries Inc.
(*2) BT93, trade name, product of ALBEMARLE ASANO CORPORATION.
(*3) IRGANOX 1010, trade name, product of CIBA SPECIALTY CHEMICALS.

Examples 1 to 4 are experimental examples making use of the respective resin compositions that the inorganic filler having an average particle diameter within a range of 1 to 10 μm was dispersed in a proportion of 10 vol. % in the resin composition. The rates of changes in dimensions after the reflow resistance test were at most 1% in both longitudinal and crosswise directions, and so good reflow resistance was demonstrated. The adhesion strength of the plating layer exceeded 2 MPa in any Example, and so good adhesion strength was demonstrated. The surface roughness Ra was also at most 1 μm in any Example, and so the surface smoothness was good. When the wire-bonding ability was evaluated, continuous bonding of at least 100 times was feasible in any Example, and the bond strength satisfied the standard of at least 40 g on the first side or at least 6 g on the second side in any Example, and was good.

Examples 5 and 6 are experimental examples making use of respective resin compositions that the flame retardant was added, and the inorganic filler having an average particle diameter within a range of 1 to 10 μm was dispersed in a proportion of 15 vol. % in the resin composition. The rates of changes in dimensions after the reflow resistance test were at most 1% in both longitudinal and crosswise directions in any Example, and so good reflow resistance was demonstrated. The adhesion strength of the plating layer far exceeded 2 MPa in any Example, and so good adhesion strength was demonstrated. The surface roughness Ra was also at most 1 μm in any Example, and so the surface smoothness was good. When the wire-bonding ability was evaluated, continuous bonding of at least 100 times was feasible in any Example, and the bond strength satisfied the standard of at least 40 g on the first side or at least 6 g on the second side in any Example, and was good. When the flame retardancy was evaluated by the UL94 testing method, it was found that the retardancy can be ranked as V-0 in any Example.

After completion of the electroless plating, a pattern of L/S=100/100 μm was formed on the samples for evaluation on plating produced in Examples 1 to 6 by laser abrasion. As a result, any sample satisfied the evaluation standard that a tolerance of a circuit width was ±10 μm or smaller.

Comparative Example 1

LCP (VECTRA C820, trade name, product of Polyplastics Co., Ltd.) of plating grade containing calcium pyrophosphate in a proportion of about 20 vol. % was used as a resin composition. The same sample as in Example 1 was produced from this LCP by means of an injection molding machine having clamping force of 40 t under conditions of a barrel temperature of 330° C., an injection pressure of 500 kg/cm$^2$, injection time of 10 seconds and a mold temperature of 60° C. This sample was then used to conduct a plating treatment in the same manner as in Example 1. The results are shown in Table 2.

Comparative Example 2

The same resin composition as in comparative Example 1 was used to produce a sample. With respect to the sample for evaluation on plating, the time of the etching treatment with the 45% aqueous solution of sodium hydroxide at 85° C. was shortened to 3 minutes. After the neutralization was then conducted with 4% hydrochloric acid, washing was sufficiently conducted in running water, a plating treatment was performed in the same manner as in Example 1, and the plate thus obtained was irradiated with 200 kGy of electron rays at accelerating voltage of 3 MeV to obtain a sample for test. The results are shown in Table 2.

Comparative Example 3

This comparative example is an experimental example carried out in the same manner as in Example 1 except that a resin composition, in which calcium pyrophosphate having the average particle diameter of 2 μm was dispersed in a proportion of 4 vol. %, not 10 vol. %>was used. The results are shown in Table 2.

Comparative Example 4

This comparative example is an experimental example carried out in the same manner as in Example 1 except that a resin composition, in which calcium pyrophosphate having the average particle diameter of 2 μm was dispersed in a proportion of 23 vol. %, not 10 vol. %, was used. The results are shown in Table 2.

Comparative Example 5

This comparative example is an experimental example carried out in the same manner as in Example 3 except that a resin composition, in which ground silica having the average particle diameter of 2 μm was dispersed in a proportion of 23 vol. %, not 10 vol. %, was used. The results are shown in Table 2.

Comparative Example 6

This comparative example is an experimental example carried out in the same manner as in Example 1 except that calcium carbonate having an average particle diameter of 0.1 μm was used in place of calcium pyrophosphate having the average particle diameter of 2 μm was used. The results are shown in Table 2.

Comparative Example 7

This comparative example is an experimental example carried out in the same manner as in Example 1 except that ground silica having an average particle diameter of 15 μm was used in place of calcium pyrophosphate having the average particle diameter of 2 μm was used. The results are shown in Table 2.

TABLE 2

| | Comparative Example | | | | | | |
|---|---|---|---|---|---|---|---|
| | 1 | 2 | 3 | 4 | 5 | 6 | 7 |
| LCP (*1) | 100 | 100 | — | — | — | — | — |
| PBT (*2) | — | — | 100 | 100 | 100 | 100 | 100 |
| Glycidyl methacrylate | — | — | 5 | 5 | 5 | 5 | 5 |
| Triallyl isocyanulate | — | — | 3 | 3 | 3 | 3 | 3 |
| Calcium pyrophosphate (average particle diameter: 2 μm) | — | — | 10 | 70 | — | — | — |
| Calcium carbonate (average particle diameter: 0.1 μm) | — | — | — | — | — | 20 | — |
| Ground silica (average particle diameter: 2 μm) | — | — | — | — | 60 | — | — |
| Ground silica (average particle diameter: 15 μm) | — | — | — | — | — | — | 20 |
| Antioxidant (*3) | — | — | 0.1 | 0.1 | 0.1 | 0.1 | 0.1 |
| Proportion of inorganic filler in resin composition (vol. %) | — | — | 4 | 23 | 23 | 10 | 10 |
| Exposure dose of electron rays (kGy) | — | — | 250 | 250 | 250 | 250 | 250 |
| Time of etching treatment (min) | 12 | 3 | 12 | 12 | 12 | 12 | 12 |
| Reflow resistance (rates of changes in dimensions) | | | | | | | |
| Longitudinal direction | 0.4 | 0.4 | 0.9 | 0.7 | 0.7 | 0.8 | 0.7 |
| Crosswise direction | 0.2 | 0.2 | 0.6 | 0.4 | 0.5 | 0.5 | 0.4 |
| Surface roughness of plating layer (Ra) | 3.4 | 0.8 | 0.3 | 5.6 | 4.5 | 0.7 | 3.2 |
| Adhesion strength of plating layer (MPa) | 3.1 | 1.2 | 0.4 | 6.2 | 3.7 | 1.6 | 2.5 |
| Wire bonding strength (g) | | | | | | | |
| First side | (*4) | 77.3 | 80.8 | (*4) | (*4) | 76.4 | (*4) |
| Second side | | 8.2 | 8.4 | | | 7.7 | |

(Note)
(*1) VECTRA C820, trade name, product of Polyplastics Co., Ltd.
(*2) TORAYCON 1401X06, trade name, product of Toray Industries Inc.
(*3) IRGANOX 1010, trade name, product of CIBA SPECIALTY CHEMICALS
(*4) Bonding was infeasible.

The following facts are found from the results shown in Table 2.

Comparative Example 1 is an experimental example that the time of the etching treatment of the LCP article was lengthened to enhance the adhesion strength of the plating layer. However, the surface roughness of the plating layer greatly exceeded 1 μm as 3.4 μm, and so the surface smoothness became poor. As a result, the wire bonding was feasible.

On the other hand, Comparative Example 2 is an experimental example that the time of the etching treatment of the LCP article was shortened to make the surface roughness of the plating layer small. However, the adhesion strength of the plating layer was lower than 2 MPs as 1.2 MPa and was insufficient.

Comparative Example 3 is an experimental example that the proportion of the inorganic filler incorporated was lowered to lower than 5 vol. %. The adhesion strength of the plating layer was lower than 2 MPs as 0.4 MPa and was insufficient.

Comparative Example 4 is an experimental example that the proportion of the inorganic filler incorporated was increased to higher than 20 vol. %. The surface roughness of the plating layer greatly exceeded 1 μm as 5.6 μm. As a result, the wire bonding was feasible.

Comparative Example 5 is also an experimental example that the proportion of the inorganic filler incorporated was increased to higher than 20 vol. %. The surface roughness of the plating layer greatly exceeded 1 μm as 4.5 μm. As a result, the wire bonding was feasible.

Comparative Example 6 is an experimental example making use of the inorganic filler having an average particle diameter lower than 1 μm. The adhesion strength of the plating layer was lower than 2 MPs as 1.6 MPa and was insufficient. Comparative Example 7 is an experimental example making use of the inorganic filler having an average particle diameter exceeding 10 μm. The surface roughness of the plating layer greatly exceeded 1 μm as 3.2 μm, and so the wire bonding was feasible.

INDUSTRIAL APPLICABILITY

According to the present invention, there can be provided plated-polyester articles which are excellent in surface smoothness and adhesion of their plating layers, have high heat resistance and can be flame-retarded as needed, and a production process thereof. Since the plated-polyester articles according to the present invention have a flat plating layer sufficient in adhesion strength and capable of wire-bonding, are excellent in heat resistance at a reflow temperature and can be highly flame-retarded as needed, they are of utility value in a production field of electronic parts such as MID used in semiconductor packages or the like.

The invention claimed is:

1. A plated-polyester article comprising a polyester article (A) and a plating layer (B) formed on the surface of the article, wherein
    (1) the polyester article (A) is irradiated with ionizing radiation to crosslink a polyester resin,
    (2) the arithmetic mean roughness Ra of the surface of the plating layer (B) is at most 1 μm, and
    (3) adhesion strength between the polyester article (A) and the plating layer (B) is at least 2 MPa,
    wherein the polyester article (A) is an article obtained by melt-molding a resin composition with an inorganic filler selected from the group consisting of calcium pyrophosphate, crushed silica and spherical silica having an average particle diameter of 1 to 10 μm dispersed in a proportion of 5 to 20 vol. % in a polyester resin crosslinkable by irradiation with ionizing radiation, and has been irradiated with ionizing radiation to crosslink the polyester resin, and further wherein the polyester article (A) has been etched with an aqueous solution of sodium hydroxide to form fine irregularities in the surface thereof.

2. The plated-polyester article according to claim 1, wherein the polyester article (A) has reflow resistance that the rates of changes in dimensions as measured under conditions that it is passed through a zone preset to 260° C. in a reflow oven in 60 seconds is at most 1% in both longitudinal and crosswise directions.

3. The plated-polyester article according to claim 1, wherein the polyester resin crosslinkable by irradiation with ionizing radiation is a polyester resin selected from the group consisting of i) a polyester resin composition obtained by incorporating a polyfunctional monomer into a polyester resin, ii) a modified polyester resin obtained by reacting a polyester resin with a polyfunctional organic compound to introduce a polymerizable functional group, iii) a modified polyester resin obtained by copolymerizing an unsaturated diol or unsaturated dicarboxylic acid in a polymerization step of a polyester resin to introduce a carbon-carbon double bond in its main chain, and iv) a polyester resin composition obtained by incorporating a polyfunctional monomer in the modified polyester resin with the polymerizable functional group introduced therein or the modified polyester resin with the carbon-carbon double bond introduced in the main chain.

4. The plated-polyester article according to claim 3, wherein the polyester resin is at least one polyester resin selected from the group consisting of polybutylene terephthalate, polyethylene terephthalate, polybutylene naphthalate, polyethylene naphthalate, polycyclohexylene terephthalate, polycyclohexylene terephthalate polyethylene terephthalate copolymers, polycyclohexylene dimethylterephthalate isophthalate copolymers and polybutylene succinate.

5. The plated-polyester article according to claim 1, wherein the polyester resin crosslinkable by irradiation with ionizing radiation further contains a flame retardant.

6. The plated-polyester article according to claim 5, wherein the flame retardant is a bromine flame retardant.

7. The plated-polyester article according to claim 5, which satisfies the standard value V-0 in the UL-94 test.

8. The plated-polyester article according to claim 1, wherein the plating layer (B) is an electroless copper plating layer or an electroless copper plating layer and a copper electroplating layer formed thereon.

9. The plated-polyester article according to claim 8, wherein the thickness of the electroless plating layer is 0.3 to 10 µm, and the thickness of the electroplating layer is 1 to 30 µm.

10. The plated-polyester article according to claim 9, wherein the thickness of the electroplating layer is 3 to 20 µm.

11. The plated-polyester article according to claim 1, wherein the fine irregularities in the surface of the polyester article (A) corresponds to the size corresponding to the particle diameter of the inorganic filler dispersed.

* * * * *